United States Patent
Miyamoto et al.

(10) Patent No.: US 12,315,684 B2
(45) Date of Patent: May 27, 2025

(54) SOLAR CELL

(71) Applicant: Panasonic Intellectual Property Management Co., Ltd., Osaka (JP)

(72) Inventors: Yumi Miyamoto, Osaka (JP); Kenji Kawano, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/354,956

(22) Filed: Jun. 22, 2021

(65) Prior Publication Data

US 2021/0327654 A1 Oct. 21, 2021

Related U.S. Application Data

(63) Continuation of application No. PCT/JP2019/030200, filed on Aug. 1, 2019.

(30) Foreign Application Priority Data

Jan. 8, 2019 (JP) .................. 2019-001388

(51) Int. Cl.
*H10K 30/30* (2023.01)
*H01G 9/20* (2006.01)
(Continued)

(52) U.S. Cl.
CPC ......... *H01G 9/2009* (2013.01); *H01G 9/2018* (2013.01); *H01G 9/209* (2013.01);
(Continued)

(58) Field of Classification Search
CPC .... H01G 9/2018; H01G 9/2009; H01G 9/209; H01L 51/4253; H01L 51/442; H01L 51/447

See application file for complete search history.

(56) References Cited

U.S. PATENT DOCUMENTS

2015/0380169 A1* 12/2015 Zhan .................. H01L 51/0032
136/255
2016/0380125 A1* 12/2016 Snaith .................. H01L 31/077
136/256

(Continued)

FOREIGN PATENT DOCUMENTS

CN 105070836 A 11/2015
WO WO-2019080594 A1 * 5/2019 .......... H01L 51/426

OTHER PUBLICATIONS

WO 2019/080594 A1 online machine translation as provided by "Patent Translate Powered by EPO and Google", translated on Oct. 7, 2021.*

(Continued)

*Primary Examiner* — Golam Mowla
(74) *Attorney, Agent, or Firm* — Rimon P.C.

(57) ABSTRACT

A solar cell according to the present disclosure includes a first electrode, a second electrode, a photoelectric conversion layer disposed between the first electrode and the second electrode, and an electron transport layer disposed between the first electrode and the photoelectric conversion layer. At least one electrode selected from the group consisting of the first electrode and the second electrode has a light-transmitting property. The photoelectric conversion layer contains a perovskite compound comprising a monovalent cation, a Sn cation, and a halogen anion. The electron transport layer contains porous $TiZnO_3$.

7 Claims, 1 Drawing Sheet

(51) Int. Cl.
  *H10K 30/50* (2023.01)
  *H10K 30/82* (2023.01)
  *H10K 30/87* (2023.01)
  *H10K 85/50* (2023.01)
  *H01L 51/42* (2006.01)
  *H01L 51/44* (2006.01)

(52) U.S. Cl.
  CPC ............ *H10K 30/30* (2023.02); *H10K 30/82* (2023.02); *H10K 30/87* (2023.02); *H10K 85/50* (2023.02); *H10K 30/50* (2023.02)

(56) References Cited

U.S. PATENT DOCUMENTS

| 2017/0040560 | A1* | 2/2017 | Martinson | H01L 31/032 |
| 2017/0069861 | A1* | 3/2017 | Ek | H01L 31/0725 |
| 2017/0309407 | A1* | 10/2017 | Suzuka | H01L 51/4253 |
| 2018/0254362 | A1* | 9/2018 | Zeng | H01L 31/032 |

OTHER PUBLICATIONS

International Search Report of PCT application No. PCT/JP2019/030200 dated Oct. 8, 2019.

Xiong Yin et al., "Ternary Oxides in the TiO2—ZnO System as Efficient Electron-Transport Layers for Perovskite Solar Cells with Efficiency over 15%", ACS Applied Materials and Interfaces 2016, 8, Oct. 14, 2016, pp. 29580-29587.

Mulmudi Hemant Kumar et al., "Lead-Free Halide Perovskite Solar Cells with High Photocurrents Realized Through Vacancy Modulation", Advanced Materials, 2014, vol. 26, Issue 41, 2014, pp. 7122-7127.

Antonio Guerrero et al., "Interfacial Degradation of Planar Lead Halide Perovskite Solar Cells", American Chemical Society Nano, 2016, vol. 10, Issue 1, pp. 218-224.

English Translation of Chinese Search Report dated Jul. 11, 2024 for the related Chinese Patent Application No. 201980081695.1.

* cited by examiner

SOLAR CELL

BACKGROUND

1. Technical Field

The present disclosure relates to a solar cell.

2. Description of the Related Art

Recently, perovskite solar cells have been studied and developed. In perovskite solar cells, a perovskite compound represented by a chemical formula $ABX_3$ (wherein A is a monovalent cation, B is a divalent cation, and X is a halogen anion) is used as a photoelectric conversion material.

In Xiong Yin et al., "Ternary Oxides in the $TiO_2$—ZnO System as Efficient Electron-Transport Layers for Perovskite Solar Cells with Efficiency over 15%", Applied Materials and Interfaces, 2016, 8, 29580-29587, a perovskite solar cell in which a perovskite compound represented by a chemical formula $CH_3NH_3PbI_{3-x}Cl_x$ (hereinafter referred to as "$MAPbI_{3-x}Cl_x$") is used as a photoelectric conversion material for the perovskite solar cell is disclosed.

In the perovskite solar cell disclosed in Xiong Yin et al., "Ternary Oxides in the $TiO_2$—ZnO System as Efficient Electron-Transport Layers for Perovskite Solar Cells with Efficiency over 15%", Applied Materials and Interfaces, 2016, 8, 29580-29587, a Pb cation, a $TiO_2$—ZnO ternary oxide, and 2,2',7,7'-tetrakis-(N,N-di-p-methoxyphenylamine)9,9'-spirobifluorene (hereinafter referred to as "Spiro-OMeTAD") are used as a divalent cation, an electron transport material, and a hole transport material, respectively.

In Mulmudi Hemant Kumar et al., "Lead-Free Halide Perovskite Solar Cells with High Photocurrents Realized through Vacancy Modulation", Advanced Materials, 2014, Volume 26, Issue 41, 7122-7127, a perovskite solar cell not containing lead is disclosed. In the perovskite solar cell not containing lead disclosed in Mulmudi Hemant Kumar et al., "Lead-Free Halide Perovskite Solar Cells with High Photocurrents Realized through Vacancy Modulation", Advanced Materials, 2014, Volume 26, Issue 41, 7122-7127, a perovskite compound represented by a chemical formula $CsSnI_3$, $TiO_2$, and Spiro-OMeTAD are used as a photoelectric conversion material, an electron transport material, and a hole transport material, respectively.

SUMMARY

One non-limiting and exemplary embodiment provides a tin perovskite solar cell having a high flat band potential.

In one general aspect, the techniques disclosed here feature a solar cell including a first electrode, a second electrode, a photoelectric conversion layer disposed between the first electrode and the second electrode, and an electron transport layer disposed between the first electrode and the photoelectric conversion layer. At least one electrode selected from the group consisting of the first electrode and the second electrode has a light-transmitting property. The photoelectric conversion layer contains a perovskite compound comprising a monovalent cation, a Sn cation, and a halogen anion. The electron transport layer contains porous $TiZnO_3$.

The present disclosure provides a tin perovskite solar cell having a high flat band potential.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Definition of Terms

The term "perovskite compound" used in the present specification refers to a perovskite crystal structure represented by a chemical formula $ABX_3$ (wherein A is a monovalent cation, B is a divalent cation, and X is a halogen anion) and a structure having crystals similar to those of the perovskite crystal structure.

The term "tin perovskite compound" used in the present specification refers to a perovskite compound containing tin.

The term "tin perovskite solar cell" used in the present specification refers to a solar cell containing a tin perovskite compound as a photoelectric conversion material.

The term "lead perovskite compound" used in the present specification refers to a perovskite compound containing lead.

The term "lead perovskite solar cell" used in the present specification refers to a solar cell containing a lead perovskite compound as a photoelectric conversion material.

Embodiment of Present Disclosure

Hereinafter, an embodiment of the present disclosure will be described in detail with reference to the drawings.

Figure 1:
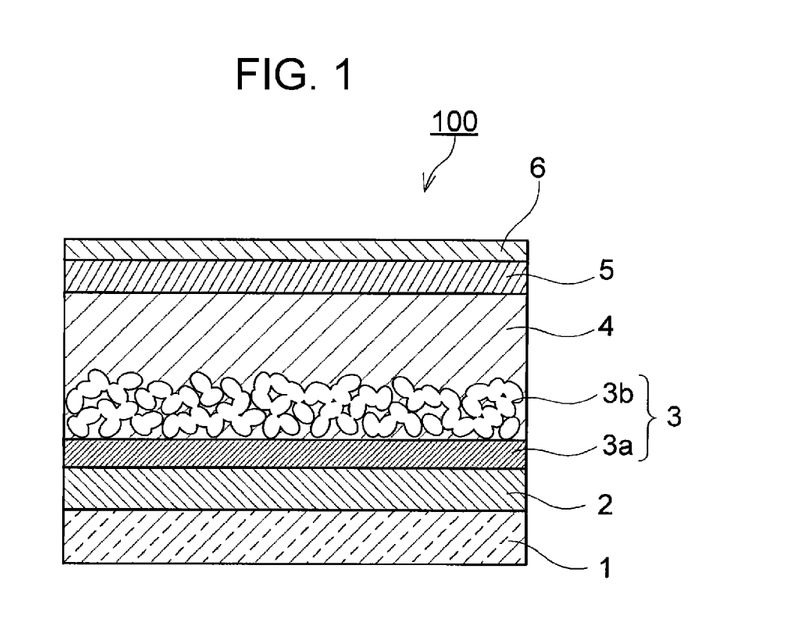
FIG. 1 illustrates a sectional view of a solar cell according to an embodiment.

As illustrated in FIG. 1, a solar cell 100 according to the present embodiment includes a first electrode 2, a second electrode 6, a photoelectric conversion layer 4 disposed between the first electrode 2 and the second electrode 6, and an electron transport layer 3 disposed between the first electrode 2 and the photoelectric conversion layer 4.

The first electrode 2 faces the second electrode 6 such that the electron transport layer 3 and the photoelectric conversion layer 4 are located between the first electrode 2 and the second electrode 6. At least one electrode selected from the group consisting of the first electrode 2 and the second electrode 6 has a light-transmitting property. In the present specification, the expression "an electrode has a light-transmitting property" refers to a status in which, of light having wavelengths of greater than or equal to 200 nm and less than or equal to 2000 nm, greater than or equal to 10% of light having a wavelength is transmitted through the electrode.

Photoelectric Conversion Layer 4

The photoelectric conversion layer 4 contains, as a photoelectric conversion material, a perovskite compound comprising a monovalent cation, a Sn cation, and a halogen anion. The photoelectric conversion material is a light-absorbing material.

In the present embodiment, the perovskite compound can be a compound represented by a composition formula $ABX_3$ (wherein A is a monovalent cation, B is a divalent cation including a Sn cation, and X is a halogen anion).

In accordance with the commonly used designation for perovskite compounds, in the present specification, A, B, and X are also referred to as an A site, a B site, and an X site, respectively.

In the present embodiment, the perovskite compound can have a perovskite crystal structure represented by the composition formula $ABX_3$ (wherein A is a monovalent cation, B is a Sn cation, and X is a halogen anion). In an example, a monovalent cation is located at the A site, $Sn^{2+}$ is located at the B site, and a halogen anion is located at the X site.

The A site, the B site, and the X site may each be occupied by a plurality of kinds of ions.

The B site includes a Sn cation, namely, $Sn^{2+}$.

A Site

The monovalent cation located at the A site is not limited. Examples of the monovalent cation A include organic cations and alkali metal cations. Examples of the organic cations include a methylammonium cation (i.e., $CH_3NH_3^+$), a formamidinium cation (i.e., $NH_2CHNH_2^+$), a phenylethylammonium cation (i.e., $C_6H_5C_2H_4NH_3^+$), and a guanidinium cation (i.e., $CH_6N_3^+$). Examples of the alkali metal cations include a cesium cation (i.e., $Cs^+$).

To achieve high photoelectric conversion efficiency, the A site may include at least one selected from the group consisting of a formamidinium cation and a methylammonium cation.

The sentence "the A site mainly includes at least one selected from the group consisting of a formamidinium cation and a methylammonium cation" refers to a status in which the molar proportion of the sum of the molar number of the formamidinium cation and the molar number of the methylammonium cation to the total molar number of the monovalent cations exceeds 50%.

The A site may be substantially composed solely of at least one selected from the group consisting of a formamidinium cation and a methylammonium cation.

The A site may mainly include a formamidinium cation. The sentence "the A site mainly includes a formamidinium cation" refers to a status in which the formamidinium cation has the highest molar amount ratio to the total molar amount of the monovalent cations. The A site may be substantially composed solely of the formamidinium cation.

X Site

The halogen anion located at the X site is, for example, an iodide ion. The halogen anion located at the X site may comprise greater than or equal to two kinds of halogen ions. To achieve high photoelectric conversion efficiency, the halogen anion located at the X site desirably includes, for example, an iodide ion.

The X site may mainly include an iodide ion. The sentence "the halogen anion mainly includes an iodide ion" refers to a status in which the iodide ion has the highest molar amount ratio to the total molar amount of the halogen anions. The X site may be substantially composed solely of the iodide ion.

The photoelectric conversion layer 4 may contain a material other than the photoelectric conversion material. For example, the photoelectric conversion layer 4 may further contain a quencher substance for reducing the defect density of the perovskite compound. The quencher substance is a fluorine compound such as tin fluoride. The molar proportion of the quencher substance to the photoelectric conversion material may be greater than or equal to 5% and less than or equal to 20%.

Photoelectric Conversion Layer 4

The photoelectric conversion layer 4 may mainly contain a perovskite compound comprising a monovalent cation, a Sn cation, and a halogen anion.

The sentence "the photoelectric conversion layer 4 mainly contains a perovskite compound comprising a monovalent cation, a Sn cation, and a halogen anion" refers to a status in which the photoelectric conversion layer 4 contains greater than or equal to 70% by mass (desirably greater than or equal to 80% by mass) of the perovskite compound comprising a monovalent cation, a Sn cation, and a halogen anion.

The photoelectric conversion layer 4 can contain an impurity. The photoelectric conversion layer 4 may further contain a compound other than the above-described perovskite compound.

The photoelectric conversion layer 4 can have a thickness of greater than or equal to 100 nm and less than or equal to 10 μm, desirably a thickness of greater than or equal to 100 nm and less than or equal to 1000 nm. The thickness of the photoelectric conversion layer 4 is dependent upon the amount of light it absorbs.

Electron Transport Layer 3

The electron transport layer 3 contains porous $TiZnO_3$ as an electron transport material. The energy level at the bottom of the conduction band of a tin perovskite compound and the energy level at the bottom of the conduction band of $TiZnO_3$ have a small difference therebetween. In an example, the absolute value of the difference can be less than 0.2 eV. Due to this small difference, the porous $TiZnO_3$ is excellent as an electron transport material.

Because the electron transport layer 3 contains the porous $TiZnO_3$, the flat band potential of the solar cell according to the present embodiment can be enhanced.

The energy level at the bottom of the conduction band of the porous $TiZnO_3$ contained in the electron transport layer 3 may be greater than or equal to −4.0 eV and less than or equal to −3.0 eV with respect to the vacuum level.

The electron transport layer 3, as an electron transport material, can mainly contain the porous $TiZnO_3$. The sentence "the electron transport layer 3, as an electron transport material, mainly contains the porous $TiZnO_3$" refers to a status in which the molar proportion of the porous $TiZnO_3$ to the total amount of the electron transport material contained in the electron transport layer 3 is greater than or equal to 50% (desirably greater than or equal to 60%).

The electron transport material contained in the electron transport layer 3 may be substantially composed of the porous $TiZnO_3$. The sentence "the electron transport material is substantially composed of the porous $TiZnO_3$" refers to a status in which the proportion of the porous $TiZnO_3$ to the total amount of the electron transport material contained in the electron transport layer 3 is greater than or equal to 90 mol % (desirably greater than or equal to 95 mol %).

The electron transport layer 3 can contain an electron transport material other than the porous $TiZnO_3$. Hereinafter, for the sake of distinction, the porous $TiZnO_3$ may be referred to as a first electron transport material and an electron transport material other than the porous $TiZnO_3$ may be referred to as a second electron transport material. The second electron transport material will be described below.

The term "porous" used in the present specification refers to a substance having a pore present inside thereof. That is, porous $TiZnO_3$ refers to $TiZnO_3$ having a pore present inside thereof. In an example, in porous $TiZnO_3$, no $TiZnO_3$ is present in a pore thereof. The porous $TiZnO_3$ may have a plurality of pores. The individual pores may have the same size as one another or different sizes from one another.

The term "dense" used in the present specification refers to a status in which a substance is assembled at a high density. Specifically, the term "dense" refers to a status in which the porosity is less than or equal to 10%. The porosity of a substance is calculated from the vacancy volume of the substance measured by a gas adsorption method and the density of the substance.

The electron transport layer 3 may be in contact with the photoelectric conversion layer 4. Alternatively, the electron transport layer 3 may be in no contact with the photoelectric conversion layer 4. When the electron transport layer 3 is in contact with the photoelectric conversion layer 4, the porous $TiZnO_3$ may be disposed at a surface of the electron transport layer 3, the surface being in contact with the photoelectric conversion layer 4. That is, the porous $TiZnO_3$ may be in contact with the photoelectric conversion layer 4. When the porous $TiZnO_3$ is in contact with the photoelectric conversion layer 4, the flat band potential of the solar cell is further enhanced.

The electron transport layer 3 may comprise a plurality of layers formed from electron transport materials different from each other. When the electron transport layer 3 comprises a plurality of layers, a layer in contact with the photoelectric conversion layer 4 can contain the porous $TiZnO_3$.

In an example, the electron transport layer 3 has a multilayer structure of a layer comprising dense $TiZnO_3$ and a layer comprising the porous $TiZnO_3$, the layer comprising the porous $TiZnO_3$ being in contact with the photoelectric conversion layer 4.

The porous $TiZnO_3$ contained in the electron transport layer 3 is a titanium-zinc composite oxide having a molar ratio of Ti to Zn to O of about 1:1:3. The porous $TiZnO_3$ according to the present embodiment may include a titanium-zinc composite oxide having a composition deviating from the composition ratio of Ti to Zn to O=1:1:3 to a certain extent (e.g., in a range of plus or minus 0.5) in a range that enables the same effects as those of the porous $TiZnO_3$ to be obtained.

The composition ratio of the porous $TiZnO_3$ can be measured by X-ray photoelectron spectroscopy (hereinafter referred to as an "XPS method"), energy dispersive X-ray analysis (hereinafter referred to as an "EDX method"), inductively coupled plasma optical emission spectrometry (hereinafter referred to as an "ICP-OES method"), or Rutherford backscattering analysis (hereinafter referred to as an "RBS method").

The porous $TiZnO_3$ contained in the electron transport layer 3 can have a porosity of greater than or equal to 20% and less than or equal to 70%. In view of effectively enhancing the flat band potential of the solar cell, the porosity is desirably greater than or equal to 20%. On the other hand, in view of retaining the structure of the electron transport layer 3, the porosity is desirably less than or equal to 70%. As demonstrated in Examples described below, desirably, the porosity is greater than or equal to 48% and less than or equal to 60%. Thus, when the porous $TiZnO_3$ having a porosity of greater than or equal to 20% and less than or equal to 70% is used, a high flat band potential and a low carrier density (i.e., a low doping density) can both be realized. In a Sn perovskite compound, $Sn^{2+}$ is likely to be oxidized to $Sn^{4+}$. As a result, Sn defects are likely to occur. Thus, a Sn perovskite compound tends to have a higher carrier density than a Pb perovskite compound. When a Sn perovskite compound has a high carrier density (i.e., defect density), carrier recombination is likely to occur. As a result, the characteristics of a device containing the Sn perovskite compound are deteriorated.

As described above, the porosity is desirably greater than or equal to 48% and less than or equal to 60%. In view of the capability of more effectively enhancing the flat band potential of the solar cell, the porosity is more desirably greater than or equal to 48%. On the other hand, in view of retaining the structure of the electron transport layer 3, the porosity is more desirably less than or equal to 60%. Thus, when the porous $TiZnO_3$ having a porosity of greater than or equal to 48% and less than or equal to 60% is used, compared with the case of the dense $TiZnO_3$, a higher flat band potential and a lower carrier density can both be realized.

Hereinafter, the second electron transport material (i.e., an electron transport material other than the porous $TiZnO_3$) will be described.

The electron transport layer 3 may contain not only the porous $TiZnO_3$ but also the dense $TiZnO_3$. That is, the second electron transport material may be the dense $TiZnO_3$.

The second electron transport material may be a material publicly known as an electron transport material for solar cells.

The second electron transport material may be a semiconductor having a band gap of greater than or equal to 3.0 eV. When the electron transport layer 3 contains a semiconductor having a band gap of greater than or equal to 3.0 eV, visible light and infrared light pass through the substrate 1, the first electrode 2, and the electron transport layer 3 and reach the photoelectric conversion layer 4. Examples of the semiconductor having a band gap of greater than or equal to 3.0 eV include organic or inorganic n-type semiconductors.

Examples of the organic n-type semiconductors include imide compounds, quinone compounds, fullerenes, and fullerene derivatives.

Examples of the inorganic n-type semiconductors include metal oxides, metal nitrides, and perovskite oxides.

Examples of the metal oxides include Cd, Zn, In, Pb, Mo, W, Sb, Bi, Cu, Hg, Ti, Ag, Mn, Fe, V, Sn, Zr, Sr, Ga, Si, and Cr. $TiO_2$ is desirable.

Examples of the metal nitrides include GaN.

Examples of the perovskite oxides include $SrTiO_3$ and $CaTiO_3$.

To enhance the photoelectric conversion efficiency of the solar cell in view of the sufficient electron transport property of the electron transport layer 3 and the low resistance of the electron transport layer 3, the electron transport layer 3 can have a thickness of greater than or equal to 1 nm and less than or equal to 500 nm.

As illustrated in FIG. 1, the electron transport layer 3 may comprise a dense layer 3a that comprises a dense electron transport material (e.g., $TiZnO_3$) and a porous layer 3b that comprises the porous $TiZnO_3$.

The porous layer 3b facilitates the formation of the photoelectric conversion layer 4. The material for the photoelectric conversion layer 4 enters the inside of the vacancies of the porous layer 3b. Due to this impregnation, the porous layer 3b serves as a scaffold for the photoelectric conversion layer 4. With the porous layer 3b being disposed, the photoelectric conversion material is unlikely to be repelled or aggregated at a surface of the dense layer 3a. Thus, the porous layer 3b facilitates the formation of the photoelectric conversion layer 4 as a uniform film.

The porous layer 3b causes light scattering. Due to the light scattering, the optical path length of light transmitted through the photoelectric conversion layer 4 increases. Due to the increase in the optical path length, the number of electrons and holes generated in the photoelectric conversion layer 4 increases.

The dense layer 3a is in contact with the first electrode 2. The dense layer 3a is a dense layer containing an electron transport material.

The porous layer 3b comprises the porous $TiZnO_3$. The porous layer 3b may further contain, as an additive, a substance other than the porous $TiZnO_3$.

The vacancies in the porous layer 3b may be connected with one another from a portion in contact with the dense layer 3a to a portion in contact with the photoelectric conversion layer 4. The vacancies contained in the porous layer 3b may be filled with the material for the photoelectric conversion layer 4. Furthermore, the material for the photoelectric conversion layer 4 may reach a surface of the dense layer 3a. Thus, electrons generated in the photoelectric conversion layer 4 reach the dense layer 3a via the porous layer 3b or directly, not via the porous layer 3b. The electron reaching the dense layer 3a move to the first electrode 2.

FIG. 1 illustrates a sectional view of a solar cell according to the embodiment. As illustrated in FIG. 1, in a solar cell 100, on a substrate 1, a first electrode 2, an electron transport layer 3, a photoelectric conversion layer 4, a hole transport layer 5, and a second electrode 6 are layered in this order. The solar cell 100 needs not to include the substrate 1. The solar cell 100 needs not to include the hole transport layer 5.

Substrate 1

The substrate 1 supports the first electrode 2, the photoelectric conversion layer 4, and the second electrode 6. The substrate 1 can be formed from a transparent material. The substrate 1 is, for example, a glass substrate or a plastic substrate. The plastic substrate is, for example, a plastic film. When the first electrode 2 has sufficient strength, the first electrode 2 supports the photoelectric conversion layer 4 and the second electrode 6, and thus the solar cell 100 needs not to include the substrate 1.

First Electrode 2 and Second Electrode 6

The first electrode 2 and the second electrode 6 have electrical conductivity. At least one electrode selected from the group consisting of the first electrode 2 and the second electrode 6 has a light-transmitting property. Such an electrode having a light-transmitting property can transmit light in the visible-light region to the near-infrared region. The electrode having a light-transmitting property can be formed from a material that is transparent and that has electrical conductivity.

Examples of such a material include:
(i) titanium oxide doped with at least one selected from the group consisting of lithium, magnesium, niobium, and fluorine;
(ii) gallium oxide doped with at least one selected from the group consisting of tin and silicon;
(iii) gallium nitride doped with at least one selected from the group consisting of silicon and oxygen;
(iv) indium-tin composite oxide;
(v) tin oxide doped with at least one selected from the group consisting of antimony and fluorine;
(vi) zinc oxide doped with at least one kind selected from the group consisting of boron, aluminum, gallium, and indium; and
(vii) composites of the foregoing.

The electrode having a light-transmitting property can be formed using an opaque material such that it has a pattern that transmits light. The pattern that transmits light is, for example, a linear pattern, a wavy-line pattern, a grid pattern, or a punching metal pattern in which many fine through-holes are regularly or irregularly arrayed. When the electrode having a light-transmitting property has such a pattern, light can be transmitted through a portion in which no electrode material is present. Examples of the opaque material include platinum, gold, silver, copper, aluminum, rhodium, indium, titanium, iron, nickel, tin, zinc, and alloys of the foregoing. Furthermore, a carbon material having electrical conductivity may be used as the opaque material.

Because the solar cell 100 includes the electron transport layer 3 between the photoelectric conversion layer 4 and the first electrode 2, the first electrode 2 needs not to have a property of blocking holes from the photoelectric conversion layer 4. Thus, the material for the first electrode 2 may be a material capable of being in ohmic contact with the photoelectric conversion layer 4.

When the solar cell 100 includes no hole transport layer 5, the second electrode 6 is formed from, for example, a material having a property of blocking electrons from the photoelectric conversion layer 4. In this case, the second electrode 6 is in no ohmic contact with the photoelectric conversion layer 4. The term "a property of blocking electrons from the photoelectric conversion layer 4" refers to a property of transmitting only holes and not transmitting electrons, the holes and the electrons having been generated in the photoelectric conversion layer 4. The Fermi energy of the material having a property of blocking electrons is lower than the energy level at the bottom of the conduction band of the photoelectric conversion layer 4. The Fermi energy of the material having a property of blocking electrons may be lower than the Fermi energy level of the photoelectric conversion layer 4. Examples of the material having a property of blocking electrons include platinum, gold, and carbon materials such as graphene.

When the solar cell 100 includes the hole transport layer 5 between the photoelectric conversion layer 4 and the second electrode 6, the second electrode 6 needs not to have a property of blocking electrons from the photoelectric conversion layer 4. In this case, the second electrode 6 may be in ohmic contact with the photoelectric conversion layer 4.

The material having a property of blocking holes from the photoelectric conversion layer 4 may have no light-transmitting property. Likewise, the material having a property of blocking electrons from the photoelectric conversion layer 4 may have no light-transmitting property. Thus, when the first electrode 2 or the second electrode 6 is formed using such a material, the first electrode 2 or the second electrode 6 has the above-described pattern formed such that light is transmitted through the first electrode 2 or the second electrode 6.

The first electrode 2 and the second electrode 6 may each have a light transmittance of greater than or equal to 50% or greater than or equal to 80%. The wavelength of light transmitted through such an electrode is dependent upon the absorption wavelength of the photoelectric conversion layer 4. The first electrode 2 and the second electrode 6 each have a thickness in a range of, for example, greater than or equal to 1 nm to less than or equal to 1000 nm.

Hole Transport Layer 5

The hole transport layer 5 comprises an organic substance or an inorganic semiconductor. Examples of a representative organic substance used as the hole transport layer 5 include 2,2',7,7'-tetrakis-(N,N-di-p-methoxyphenylamine)9,9'-spirobifluorene (hereinafter referred to as "Spiro-OMeTAD"), poly[bis(4-phenyl)(2,4,6-trimethylphenyl)amine] (hereinafter referred to as "PTAA"), poly(3-hexylthiophene-2,5-diyl)

(hereinafter referred to as "P3HT"), poly(3,4-ethylenedioxy-thiophene) (hereinafter referred to as "PEDOT"), and copper phthalocyanine (hereinafter referred to as "CuPC").

Examples of the inorganic semiconductor include $Cu_2O$, $CuGaO_2$, CuSCN, CuI, $NiO_x$, $MoO_x$, $V_2O_5$, and carbon materials such as graphene oxide.

The hole transport layer 5 may contain a plurality of layers formed from materials different from each other.

The hole transport layer 5 may have a thickness of greater than or equal to 1 nm and less than or equal to 1000 nm, greater than or equal to 10 nm and less than or equal to 500 nm, or greater than or equal to 10 nm and less than or equal to 50 nm. When the hole transport layer 5 has a thickness of greater than or equal to 1 nm and less than or equal to 1000 nm, a sufficient hole transport property can be exhibited. Furthermore, when the hole transport layer 5 has a thickness of greater than or equal to 1 nm and less than or equal to 1000 nm, the hole transport layer 5 has low resistance, and thus light is converted to electricity with high efficiency.

The hole transport layer 5 may contain a supporting electrolyte and a solvent. The supporting electrolyte and the solvent stabilize holes in the hole transport layer 5.

Examples of the supporting electrolyte include ammonium salts and alkali metal salts. Examples of the ammonium salts include tetrabutylammonium perchlorate, tetraethylammonium hexafluorophosphate, imidazolium salts, and pyridinium salts. Examples of the alkali metal salts include lithium bis(trifluoromethanesulfonyl)imide (hereinafter referred to as "LiTFSI"), $LiPF_6$, $LiBF_4$, lithium perchlorate, and potassium tetrafluoroborate.

The solvent contained in the hole transport layer 5 may have high ionic conductivity. The solvent can be an aqueous solvent or an organic solvent. In view of stabilizing the solute, organic solvents are desirable. Examples of the organic solvents include heterocyclic compounds such as tert-butylpyridine, pyridine, and n-methylpyrrolidone.

The solvent contained in the hole transport layer 5 may be an ionic liquid. The ionic liquid can be used alone or in mixture with another solvent. The ionic liquid is desirable in terms of low volatility and high flame retardancy.

Examples of the ionic liquid include imidazolium compounds such as 1-ethyl-3-methylimidazolium tetracyanoborate, pyridine compounds, alicyclic amine compounds, aliphatic amine compounds, and azonium amine compounds.

Figure 2:
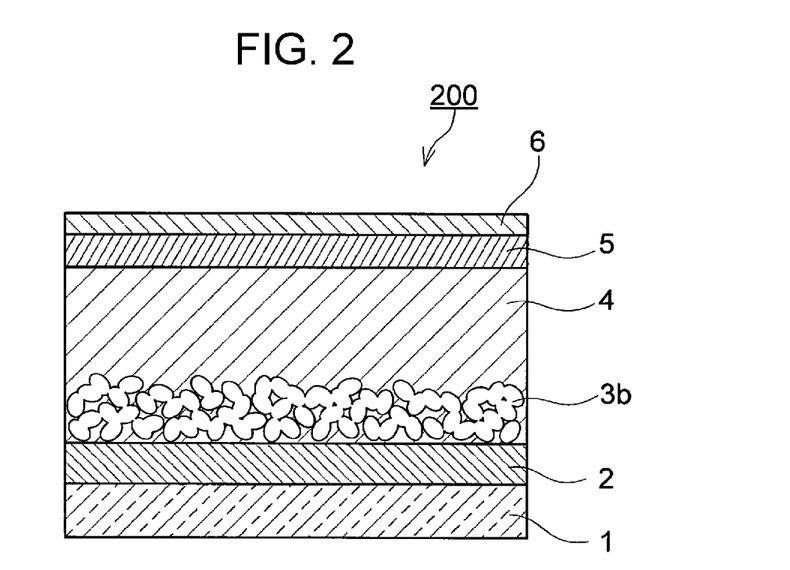
FIG. 2 illustrates a sectional view of a modification of the solar cell according to the embodiment.

FIG. 2 illustrates a sectional view of a modification of the solar cell according to the embodiment.

A solar cell 200 illustrated in FIG. 2 is the same as the solar cell 100 illustrated in FIG. 1 except that the electron transport layer 3 is composed solely of the porous layer 3b. The solar cell 200 includes no dense layer 3a, but the basic operational effects of the solar cell 200 are the same as those of the solar cell 100.

Next, the basic operational effects of the solar cell 100 will be described. When the solar cell 100 is irradiated with light, the photoelectric conversion layer 4 absorbs the light to thereby generate excited electrons and holes inside the photoelectric conversion layer 4. The excited electrons are moved to the electron transport layer 3. On the other hand, the holes generated in the photoelectric conversion layer 4 are moved to the hole transport layer 5. The electron transport layer 3 is connected to the first electrode 2 and the hole transport layer 5 is connected to the second electrode 6, and thus, current is drawn from the first electrode 2 functioning as a negative electrode and the second electrode 6 functioning as a positive electrode.

Method for Producing Solar Cell 100

The solar cell 100 can be produced by, for example, the following method.

First, a first electrode 2 is formed on a surface of a substrate 1 by a chemical vapor deposition method (hereinafter referred to as a "CVD method") or a sputtering method.

A dense layer 3a is formed on the first electrode 2 by a coating method, such as a spin coating method, or a sputtering method. Hereinafter, a method for forming the dense layer 3a comprising dense $TiZnO_3$ will be described. In the spin coating method, a solution in which a Ti raw material and a Zn raw material are dissolved is prepared. Examples of the Ti raw material include tetraisopropyl orthotitanate and $TiCl_4$. Examples of the Zn raw material include $ZnCl_2$ and zinc acetate. Examples of the solvent of the solution include isopropanol and ethanol.

The solution is applied to the first electrode 2 by a spin coating method to thereby form a coating film. The coating film is heat-treated in air at a temperature of greater than or equal to 30° C. and less than or equal to 700° C.

A porous layer 3b is applied to the dense layer 3a by a coating method such as a spin coating method. As described above, the porous layer 3b comprises porous $TiZnO_3$. In the spin coating method, a solution in which a Ti raw material and a Zn raw material are dissolved is prepared. Examples of the Ti raw material include tetrabutyl orthotitanate and $TiCl_4$. Examples of the Zn raw material include $ZnCl_2$, zinc nitrate hexahydrate, and zinc acetate. Examples of the solvent of the solution include ethanol, benzyl alcohol, and 1,3-propanediol.

The solution is heated to thereby obtain a $TiZnO_3$ dispersion. A pore-forming agent is added to the obtained $TiZnO_3$ dispersion to thereby prepare a porous $TiZnO_3$ raw material solution. Examples of the pore-forming agent include ethyl cellulose.

The porous $TiZnO_3$ raw material solution is applied to the dense layer 3a by a spin coating method to thereby form a coating film. The coating film is heat-treated at a temperature of greater than or equal to 100° C. and less than or equal to 700° C. The porous layer 3b is thus formed.

A photoelectric conversion layer 4 is formed on the electron transport layer 3 (i.e., on the porous layer 3b). The photoelectric conversion layer 4 can be formed, for example, as follows. Hereinafter, as an example, a method for forming a photoelectric conversion layer 4 containing a perovskite compound represented by $(HC(NH_2)_2)_{1-y}(C_6H_5CH_2CH_2NH_3)_ySnI_3$ (wherein 0<y<1, hereinafter referred to as "$FA_{1-y-z}PEA_ySnI_3$") will be described.

First, $SnI_2$, $HC(NH_2)_2I$ (hereinafter referred to as "FAI"), and $C_6H_5CH_2CH_2NH_3I$ (hereinafter referred to as "PEAI") are added to an organic solvent to thereby obtain a mixed liquid. The organic solvent is, for example, a mixture of dimethyl sulfoxide (hereinafter referred to as "DMSO") and N,N-dimethylformamide (hereinafter referred to as "DMF") (volume ratio=1:1).

The molar concentration of the $SnI_2$ may be greater than or equal to 0.8 mol/L and less than or equal to 2.0 mol/L or may be greater than or equal to 0.8 mol/L and less than or equal to 1.5 mol/L.

The molar concentration of the FAI may be greater than or equal to 0.8 mol/L and less than or equal to 2.0 mol/L or may be greater than or equal to 0.8 mol/L and less than or equal to 1.5 mol/L.

The molar concentration of the PEAI may be greater than or equal to 0.1 mol/L and less than or equal to 0.6 mol/L or may be greater than or equal to 0.3 mol/L and less than or equal to 0.5 mol/L.

Next, the mixed liquid is heated to a temperature of greater than or equal to 40° C. and less than or equal to 180° C. A mixed solution in which the $SnI_2$, the FAI, and the PEAI are dissolved is thus obtained. Subsequently, the mixed solution is left to stand at a room temperature.

Next, the mixed solution is applied to the electron transport layer 3 (i.e., to the porous layer 3b) by a spin coating method to thereby form a coating film. Subsequently, the coating film is heated at a temperature of greater than or equal to 40° C. and less than or equal to 100° C. for greater than or equal to 15 minutes and less than or equal to 1 hour. The photoelectric conversion layer 4 is thus formed. When the mixed solution is applied by the spin coating method, a poor solvent may be added dropwise during the spin coating. Examples of the poor solvent include toluene, chlorobenzene, and diethyl ether.

The mixed solution may contain a quencher substance such as tin fluoride. The concentration of the quencher substance may be greater than or equal to 0.05 mol/L and less than or equal to 0.4 mol/L. Due to the quencher substance, defect generation in the photoelectric conversion layer 4 is prevented or reduced. The cause of defect generation in the photoelectric conversion layer 4 is, for example, an increase in the amount of Sn vacancies due to an increase in the amount of $Sn^{4+}$.

A hole transport layer 5 is formed on the photoelectric conversion layer 4. The method for forming the hole transport layer 5 is, for example, a coating method or a printing method. Examples of the coating method include a doctor blade method, a bar coating method, a spraying method, a dip coating method, and a spin coating method. Examples of the printing method include a screen printing method. A plurality of materials may be mixed to thereby obtain the hole transport layer 5 and, subsequently, the hole transport layer 5 may be pressurized or heat-treated. When the material for the hole transport layer 5 is an organic low-molecular-weight substance or an inorganic semiconductor, the hole transport layer 5 may be produced by a vacuum deposition method.

Finally, a second electrode 6 is formed on the hole transport layer 5. The solar cell 100 is thus obtained. The second electrode 6 can be formed by a CVD method or a sputtering method.

Underlying Knowledge Forming Basis of the Present Disclosure

The underlying knowledge forming basis of the present disclosure is as follows.

Tin perovskite compounds, as a photoelectric conversion material, have excellent physical properties. Thus, tin perovskite solar cells are expected to output a high voltage. However, in reality, existing tin perovskite solar cells have not been able to output a voltage as high as expected from their excellent physical properties.

It is known that, in general, one of the factors for the deterioration of the voltage level of a solar cell is the inconsistency between the energy level at the bottom of the conduction band of an electron transport material and the energy level at the bottom of the conduction band of a photoelectric conversion material. More specifically, when this inconsistency exists, the probability of electron presence at and near the interface of an electron transport layer 3 and a photoelectric conversion layer 4 is increased. As a result, the probability of carrier recombination at the interface is increased, and thus a voltage loss occurs. The value of "the energy level at the bottom of the conduction band" in the present specification is a value determined with respect to the vacuum level.

The energy level at the bottom of the conduction band of a tin perovskite compound can be about −3.4 eV. The representative electron transport material used in existing tin perovskite solar cells is $TiO_2$. The energy level at the bottom of the conduction band of $TiO_2$ is −4.0 eV. The difference therebetween is as large a value of 0.6 eV. This large value is the cause of the inconsistency.

Thus, in existing tin perovskite solar cells, the inconsistency between the energy level at the bottom of the conduction band of an electron transport material and the energy level at the bottom of the conduction band of a photoelectric conversion material exists. The present inventors have found that, to enhance the output voltage of a tin perovskite solar cell, the use of an electron transport material having an energy level at the bottom of the conduction band shallower than the energy level at the bottom of the conduction band of $TiO_2$ is required.

The present inventors have focused on $TiZnO_3$ as an electron transport material. The reason why the present inventors have focused on $TiZnO_3$ is because the energy level at the bottom of the conduction band of $TiZnO_3$ and the energy level at the bottom of the conduction band of a tin perovskite compound have a small difference therebetween.

The energy level at the bottom of the conduction band of $TiZnO_3$ is −3.2 eV. That is, $TiZnO_3$ has an energy level at the bottom of the conduction band shallower than that of $TiO_2$ which is a common electron transport material for existing tin perovskite solar cells. As described above, the energy level at the bottom of the conduction band of a tin perovskite solar cell is −3.4 eV. Thus, the difference therebetween is as small a value of 0.2 eV. Due to the small energy level difference, $TiZnO_3$ is suited as an electron transport material contained in a tin perovskite solar cell.

However, when $TiZnO_3$ is used as an electron transport material, it is difficult to enhance the flat band potential. The present inventors have newly found that, by using a porous body of $TiZnO_3$ as an electron transport material, the flat band potential can be effectively enhanced.

Based on the foregoing knowledge, the present inventors provide a solar cell containing a tin perovskite compound and having a high flat band potential.

EXAMPLES

Hereinafter, the present disclosure will be described in further detail with reference to Examples below. As described below, in Examples 1 to 4 and Comparative Examples 1 to 5, solar cells including an electron transport layer 3 and a photoelectric conversion layer 4 containing a perovskite compound were produced. Furthermore, the characteristics of each of the solar cells were evaluated. The solar cells of Examples 1 to 4 and Comparative Examples 1 to 3 were tin perovskite solar cells having the same structure as the perovskite solar cell 100 illustrated in FIG. 1. The solar cells of Comparative Examples 4 and 5 also had the same structure as the perovskite solar cell 100 illustrated in FIG. 1. It is to be noted that the solar cells of Comparative Examples 4 and 5 were not tin perovskite solar cells but lead perovskite solar cells.

Example 1

A glass substrate (manufactured by Nippon Sheet Glass Co., Ltd.) including an indium-doped $SnO_2$ layer in the surface was prepared. The glass substrate and the $SnO_2$ layer functioned as a substrate 1 and a first electrode 2, respectively. The glass substrate had a thickness of 1 mm.

Tetraisopropyl orthotitanate (manufactured by Sigma-Aldrich Co. LLC, hereafter referred to as "TTIT") and zinc chloride (manufactured by FUJIFILM Wako Pure Chemical Corporation) were dissolved in isopropanol (manufactured by FUJIFILM Wako Pure Chemical Corporation, hereafter referred to as "IPA") to thereby prepare an IPA solution. The concentration of the TTIT contained in the IPA solution was 15 mmol/L. The concentration of the zinc chloride contained in the IPA solution was 6.5 mmol/L.

The IPA solution was applied to the first electrode 2 by a spin coating method to thereby obtain a coating film. The coating film was heat-treated in air at 350° C. for 1 hour to thereby form a dense layer 3a.

The dense layer 3a had a thickness of 10 nm.

The molar ratio of Ti to Zn in the dense layer 3a was 15:6.5.

Next, a porous layer 3b was formed as follows.

First, zinc nitrate hexahydrate (1.356 g, manufactured by FUJIFILM Wako Pure Chemical Corporation) was dissolved in ethanol (3.185 mL, manufactured by FUJIFILM Wako Pure Chemical Corporation) to thereby obtain an ethanol solution containing the zinc nitrate hexahydrate in a concentration of 1.43 mol/L.

Titanium butoxide (4.56 mmol) was added dropwise to the ethanol solution to thereby obtain a mixed solution. The mixed solution was stirred.

The molar ratio of Ti to Zn was 1.

Benzyl alcohol (9.61 mL, manufactured by Kanto Chemical Co., Inc.) and 1,3-propanediol (0.113 mL, manufactured by Sigma-Aldrich Co. LLC) were added to the mixed solution. After the addition, the mixed solution was heated at 80° C. for 8 hours to thereby prepare a $TiZnO_3$ dispersion.

Ethyl cellulose (0.178 g) was dissolved in ethanol (8.06 mL) and, subsequently, terpineol (45 µL) was added thereto to thereby prepare an ethanol solution of the ethyl cellulose. The ethyl cellulose contained in the ethanol solution had a concentration of 5.3% by mass.

The $TiZnO_3$ dispersion and the ethanol solution of the ethyl cellulose prepared as described above were mixed such that the mixture had a mass ratio of $TiZnO_3$ to ethyl cellulose of 1:0.27. A porous $TiZnO_3$ raw material solution was thus prepared.

The porous $TiZnO_3$ raw material solution was applied to the dense layer 3a by a spin coating method to thereby form a coating film. The coating film was preliminarily heat-treated at 80° C. for 10 minutes. The preliminarily heat-treated film was thereafter placed into an electric furnace and heat-treated at 400° C. for 4 hours to thereby form a porous layer 3b formed from porous $TiZnO_3$. The composition $TiZnO_3$ of the material composing the porous layer 3b was expressed based on the molar ratio of Ti to Zn in the starting substance.

An electron transport layer 3 including the dense layer 3a and the porous layer 3b was thus formed.

Next, a solution containing $SnI_2$ (manufactured by Sigma-Aldrich Co. LLC), $SnF_2$ (manufactured by Sigma-Aldrich Co. LLC), FAI (manufactured by GreatCell Solar Ltd.), and PEAI (manufactured by GreatCell Solar Ltd.) was prepared. The concentrations of the $SnI_2$, the $SnF_2$, the FAI, and the PEAI were 1.5 mol/L, 0.15 mol/L, 1.5 mol/L, and 0.3 mol/L, respectively. The solvent of the solution was a mixture of DMSO (i.e., dimethyl sulfoxide) and DMF (i.e., N,N-dimethylformamide) (DMSO:DMF=1:1 (volume ratio)).

In a glovebox, the solution (80 µL) was applied to the electron transport layer 3 by a spin coating method to thereby form a coating film. The coating film had a thickness of 450 nm. A portion of the solution impregnated inside the vacancies of the porous layer 3b. Thus, the thickness of the coating film (i.e., 450 nm) includes the thickness of the porous layer 3b. The thickness of the porous layer 3b was 224 nm.

The coating film was heat-treated at 80° C. for 30 minutes on a hotplate to thereby form a photoelectric conversion layer 4. The photoelectric conversion layer 4 mainly contained a perovskite compound represented by a composition formula $FA_{0.83}PEA_{0.17}SnI_3$. The energy level at the bottom of the conduction band of the perovskite compound represented by the composition formula $FA_{0.83}PEA_{0.17}SnI_3$ was −3.4 eV with respect to the vacuum level.

In a glovebox, a toluene solution (80 µL) containing PTAA (i.e., poly[bis(4-phenyl)(2,4,6-trimethylphenyl)amine], manufactured by Sigma-Aldrich Co. LLC) in a concentration of 10 mg/mL was applied to the photoelectric conversion layer 4 by a spin coating method to thereby form a hole transport layer 5.

Finally, a gold film having a thickness of 100 nm was vapor-deposited on the hole transport layer 5 to thereby form a second electrode 6. A solar cell of Example 1 was thus obtained.

Example 2

In Example 2, the same method as in Example 1 was performed to obtain a solar cell of Example 2 except that the $TiZnO_3$ dispersion and the ethanol solution of the ethyl cellulose were mixed such that the mixture had a mass ratio of $TiZnO_3$ to ethyl cellulose of 1:1.2 to thereby prepare a porous $TiZnO_3$ raw material solution.

Example 3

In Example 3, the same method as in Example 1 was performed to obtain a solar cell of Example 3 except that the $TiZnO_3$ dispersion and the ethanol solution of the ethyl cellulose were mixed such that the mixture had a mass ratio of $TiZnO_3$ to ethyl cellulose of 1:7.2 to thereby prepare a porous $TiZnO_3$ raw material solution.

Example 4

In Example 4, the same method as in Example 1 was performed to obtain a solar cell of Example 4 except for the following two items (i) and (ii):

(i) in the formation of the dense layer 3a, to make the molar ratio of Ti to Zn in the starting substance equivalent to 1:1, the concentrations of the TTIT and the zinc chloride contained in the IPA solution were 10.8 mmol/L and 10.8 mmol/L, respectively; and (ii) in the same manner as in the case of Example 3, the $TiZnO_3$ dispersion and the ethanol solution of the ethyl cellulose were mixed such that the mixture had a mass ratio of $TiZnO_3$ to ethyl cellulose of 1:7.2 to thereby prepare a porous $TiZnO_3$ raw material solution.

Comparative Example 1

In Comparative Example 1, the same method as in Example 1 was performed to obtain a solar cell of Comparative Example 1 except that no porous layer 3b was formed. That is, the electron transport layer 3 of the solar cell of Comparative Example 1 contained no porous $TiZnO_3$.

Comparative Example 2

In Comparative Example 2, the same method as in Example 1 was performed to obtain a solar cell of Comparative Example 2 except for the following two items (i) and (ii):
(i) the dense layer 3a was formed by forming titanium oxide represented by a chemical formula $TiO_2$ on the first electrode 2 by a sputtering method; and
(ii) the porous layer 3b was formed as follows.

First, titanium oxide powder having an average primary particle size of 30 nm (manufactured by GreatCell Solar Ltd.) was dispersed in an ethanol solution of the ethyl cellulose to thereby prepare a $TiO_2$ paste.

The $TiO_2$ paste was applied to the dense layer 3a to thereby obtain a coating film. The coating film was preliminarily heat-treated at 100° C.

Finally, the preliminarily heat-treated coating film was heat-treated in air at 500° C. for 30 minutes to thereby form a porous layer 3b.

Comparative Example 3

In Comparative Example 3, the same method as in Example 1 was performed to obtain a solar cell of Comparative Example 3 except for the following item (i):
(i) in the formation of the porous layer 3b, the weight of the zinc nitrate hexahydrate was 1.356 g. In Comparative Example 3, the molar ratio of Ti to Zn in the starting substance was equivalent to 3:1 and the zinc nitrate hexahydrate contained in the ethanol solution was 0.48 mol/L.

Comparative Example 4

In Comparative Example 4, the same method as in Example 1 was performed to obtain a solar cell of Comparative Example 4 except that the photoelectric conversion layer 4 was not the tin perovskite compound represented by the composition formula $FA_{0.83}PEA_{0.17}SnI_3$ but a lead perovskite compound represented by $FA_{0.83}PEA_{0.17}PbI_3$.

The lead perovskite compound represented by $FA_{0.83}PEA_{0.17}PbI_3$ was obtained in the same manner as in the case of the tin perovskite compound represented by the composition formula $FA_{0.83}PEA_{0.17}SnI_3$ of Example 1 except that, in place of the $SnI_2$ (1.5 mol/L) and the $SnF_2$ (0.15 mol/L), $PbI_2$ (1.5 mol/L, manufactured by Sigma-Aldrich Co. LLC) was used.

The energy level at the bottom of the conduction band of the perovskite compound represented by the composition formula $FA_{0.83}PEA_{0.17}PbI_3$ was −4.0 eV with respect to the vacuum level.

Comparative Example 5

In Comparative Example 5, the same method as in Example 1 was performed to obtain a solar cell of Comparative Example 5 except for the following three items (i) to (iii):
(i) in the same manner as in the case of Comparative Example 2, the dense layer 3a was formed by forming titanium oxide represented by the chemical formula $TiO_2$ on the first electrode 2 by a sputtering method;
(ii) in the same manner as in the case of Comparative Example 2, the porous layer 3b was formed as follows. First, titanium oxide powder having an average primary particle size of 30 nm (manufactured by GreatCell Solar Ltd.) was dispersed in an ethanol solution of the ethyl cellulose to thereby prepare a $TiO_2$ paste. Next, the $TiO_2$ paste was applied to the dense layer 3a to thereby obtain a coating film. The coating film was preliminarily heat-treated at 100° C. Finally, the preliminarily heat-treated coating film was heat-treated in air at 500° C. for 30 minutes to thereby form a porous layer 3b; and
(iii) as in the case of Comparative Example 4, the photoelectric conversion layer 4 was not the tin perovskite compound represented by the composition formula $FA_{0.83}PEA_{0.17}SnI_3$ but the lead perovskite compound represented by $FA_{0.83}PEA_{0.17}PbI_3$.

Calculation of Energy Level at Bottom of Conduction Band of Electron Transport Material Contained in Porous Layer 3b In each of Examples and Comparative Examples, a sample constituted by the substrate 1, the first electrode 2, and the electron transport layer 3 was prepared. The sample included neither the photoelectric conversion layer 4, the hole transport layer 5, nor the second electrode 6. That is, the surface of the electron transport layer 3 was exposed.

The energy level at the bottom of the conduction band of the electron transport material contained in the porous layer 3b of the electron transport layer 3 included in each sample was measured by ultraviolet electron spectrometry and a transmittance measurement method as follows. In Comparative Example 1, the energy level at the bottom of the conduction band of the electron transport material contained in the dense layer 3a was measured.

Each sample was subjected to ultraviolet electron spectrometry using an ultraviolet electron spectrometer (manufactured by ULVAC-PHI, Inc., trade name: PHI 5000 VersaProbe) and the value of the energy level at the top of the valence band of each electron transport material was obtained.

Each sample was subjected to transmittance measurement using a transmittance measurement apparatus (manufactured by Shimadzu Corporation, trade name: SolidSpec-3700), and, subsequently, from the results of the transmittance measurement, the value of the band gap of each electron transport material was obtained.

Based on the value of the energy level at the top of the valence band and the value of the band gap obtained in the above-described manner, the energy level at the bottom of the conduction band of each electron transport material was calculated.

The energy level at the bottom of the conduction band of each material thus calculated is as follows.

| | |
|---|---|
| Porous $TiZnO_3$ | −3.20 eV |
| Porous $TiO_2$ | −3.70 eV |
| Porous $Ti_{1.5}Zn_{0.5}O_3$ | −4.01 eV |
| Dense $Ti_{1.5}Zn_{0.5}O_3$ | −3.24 eV |

Porosity of Porous Layer 3b

The porosity of the porous layer 3b of Examples and Comparative Examples was calculated from the vacancy volume of the porous layer 3b obtained by a gas adsorption measurement method using a gas adsorption apparatus (manufactured by Micromeritics Instrument Corporation, trade name: ASAP) and the density of the electron transport material contained in the porous layer 3b (i.e., $TiZnO_3$ or $TiO_2$).

Flat Band Potential and Carrier Density

The impedance of the solar cells of Examples and Comparative Examples was measured using an impedance measurement system (manufactured by Solartron Analytical Co., trade name: ModuLab XM), and the flat band potential and the carrier density were calculated based on the method disclosed in Antonio Guerrero et al., "Interfacial Degradation of Planar Lead Halide Perovskite Solar Cells", American Chemical Society Nano, 2016, Vol. 10, Issue 1, pp. 218-224.

Change in Color of Perovskite Compound

The present inventors visually observed whether the color of the perovskite compound contained in the solar cells of Examples and Comparative Examples was changed.

Tables 1 and 2 present the photoelectric conversion material, the electron transport material, the mass ratio of ethyl cellulose (i.e., a pore-forming agent) to titanium-zinc composite oxide (i.e., $TiZnO_3$ or $Ti_{1.5}Zn_{0.5}O_3$), the porosity, the change in the color of the perovskite compound, the flat band potential, and the carrier density found in the solar cells of Examples and Comparative Examples.

Each electron transport material presented in Tables 1 and 2 is the electron transport material contained in the electron transport layer 3 and in a portion in contact with the photoelectric conversion layer 4.

TABLE 1

| | Photoelectric conversion layer | Electron transport layer | Mass ratio of ethyl cellulose to titanium-zinc composite oxide |
|---|---|---|---|
| Comparative Example 1 | $FA_{0.83}PEA_{0.17}SnI_3$ | Dense $Ti_{1.5}Zn_{0.5}O_3$ | — |
| Example 1 | | Porous $TiZnO_3$ | 0.27 |
| Example 2 | | and | 1.2 |
| Example 3 | | dense $Ti_{1.5}Zn_{0.5}O_3$ | 7.2 |
| Example 4 | | Porous $TiZnO_3$ and dense $TiZnO_3$ | 7.2 |
| Comparative Example 2 | | Porous $TiO_2$ and dense $TiO_2$ | — |
| Comparative Example 3 | | Porous $Ti_{1.5}Zn_{0.5}O_3$ and dense $Ti_{1.5}Zn_{0.5}O_3$ | 1.2 |
| Comparative Example 4 | $FA_{0.83}PEA_{0.17}PbI_3$ | Porous $TiZnO_3$ and dense $Ti_{1.5}Zn_{0.5}O_3$ | 1.2 |
| Comparative Example 5 | | Porous $TiO_2$ and dense $TiO_2$ | — |

TABLE 2

| | Porosity | Change in color of perovskite compound | Flat band potential (V) | Carrier density ($cm^{-3}$) |
|---|---|---|---|---|
| Comparative Example 1 | 0 | Unobserved | 0.59 | $2.59 \times 10^{17}$ |
| Example 1 | 0.48 | Unobserved | 1.15 | $5.20 \times 10^{16}$ |
| Example 2 | 0.58 | Unobserved | 0.91 | $2.61 \times 10^{15}$ |
| Example 3 | 0.60 | Unobserved | 1.06 | $3.62 \times 10^{15}$ |
| Example 4 | 0.60 | Unobserved | 1.21 | $4.89 \times 10^{15}$ |
| Comparative Example 2 | 0.66 | Unobserved | 0.28 | $9.44 \times 10^{15}$ |
| Comparative Example 3 | — | Unobserved | 0.74 | $1.21 \times 10^{16}$ |
| Comparative Example 4 | 0.58 | Observed | 1.40 | $3.24 \times 10^{15}$ |
| Comparative Example 5 | 0.66 | Unobserved | 0.84 | $1.86 \times 10^{15}$ |

As evident from Table 1, the solar cells of Examples 1 to 4 include the photoelectric conversion layer 4 containing the tin perovskite compound and the electron transport layer 3 containing the porous $TiZnO_3$, and thus the solar cells of Examples 1 to 4 have a high flat band potential exceeding 0.9 V. Furthermore, the solar cells of Examples 1 to 4 have a carrier density of greater than or equal to $2.61 \times 10^{15}$ and less than or equal to $5.20 \times 10^{16}$, and thus the solar cells of Examples 1 to 4 are considered to obtain high photoelectric conversion efficiency.

As evident from the comparison between Example 1 and Comparative Example 2, when the porous $TiZnO_3$ has a relatively low voidage (e.g., about 0.48, see Example 1), the solar cell has a higher flat band potential than when the porous $TiZnO_3$ has a relatively high voidage (e.g., about 0.66, see Comparative Example 2). The inventors consider this to be because $TiZnO_3$ is more excellent than $TiO_2$ in terms of the consistency with the energy level at the bottom of the conduction band of the tin perovskite compound.

In the solar cells of Examples 1 to 3 and the solar cell of Comparative Example 1, the tin perovskite compound is used as the photoelectric conversion material. On the other hand, whereas the solar cells of Examples 1 to 3 contain the porous $TiZnO_3$ in the electron transport layer 3, the solar cell of Comparative Example 1 contains the dense $Ti_{1.5}Zn_{0.5}O_3$, instead of the porous $TiZnO_3$, in the electron transport layer 3. In other words, whereas, in the solar cells of Examples 1 to 3, the electron transport material in contact with the tin perovskite compound is the porous $TiZnO_3$, in the solar cell of Comparative Example 1, the electron transport material in contact with the tin perovskite compound is the dense $Ti_{1.5}Zn_{0.5}O_3$.

The solar cells of Examples 1 to 3 have a high flat band potential of greater than or equal to 0.9 V. On the other hand, the solar cell of Comparative Example 1 has a low flat band potential of 0.59 V.

It is understood from these results that the use of porous $TiZnO_3$ enables the flat band potential to be effectively enhanced.

In the solar cell of Comparative Example 4, the lead perovskite compound and the porous $TiZnO_3$ are used as the photoelectric conversion material and the electron transport material, respectively. Although the solar cell of Comparative Example 4 has a high flat band potential and a low carrier density, in Example 4, the color of the lead perovskite compound was changed from black to yellow. This suggests that, in the solar cell of Comparative Example 4, the lead perovskite compound was decomposed, and that, as a result, the function of the photoelectric conversion layer 4 was deteriorated.

Thus, a lead perovskite compound is considered to be discomposed when porous $TiZnO_3$ is used in combination with the lead perovskite compound.

Thus, the electron transport material suitable for a tin perovskite compound is different from the electron transport material suitable for a lead perovskite compound. Thus, even when the same electron transport material is used in a lead perovskite solar cell and in a tin perovskite solar cell, the performances of these solar cells are different from each other.

The solar cell according to the present disclosure is useful, for example, as a solar cell disposed on a roof.

What is claimed is:

1. A solar cell comprising:
   a first electrode;
   a second electrode;
   a photoelectric conversion layer disposed between the first electrode and the second electrode; and
   an electron transport layer disposed between the first electrode and the photoelectric conversion layer, wherein at least one electrode selected from the group consisting of the first electrode and the second electrode has a light-transmitting property, the photoelectric conversion layer contains a perovskite compound comprising a monovalent cation, a Sn cation, and a halogen anion, and the electron transport layer contains porous $TiZnO_3$.

2. The solar cell according to claim 1,
wherein the porous $TiZnO_3$ has a porosity of greater than or equal to 20% and less than or equal to 70%.

3. The solar cell according to claim 2,
wherein the porous $TiZnO_3$ has a porosity of greater than or equal to 48% and less than or equal to 60%.

4. The solar cell according to claim 1,
wherein the monovalent cation includes at least one selected from the group consisting of a formamidinium cation and a methylammonium cation.

5. The solar cell according to claim 1,
wherein the halogen anion includes an iodide ion.

6. The solar cell according to claim 1, further comprising:
a hole transport layer disposed between the second electrode and the photoelectric conversion layer.

7. The solar cell according to claim 1,
wherein the porous $TiZnO_3$ is in contact with the photoelectric conversion layer.

* * * * *